United States Patent
Kim et al.

(10) Patent No.: US 6,944,804 B1
(45) Date of Patent: Sep. 13, 2005

(54) SYSTEM AND METHOD FOR MEASURING PSEUDO PIXEL ERROR RATE

(75) Inventors: Gyudong Kim, San Jose, CA (US); Min-Kyu Kim, Cupertino, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 581 days.

(21) Appl. No.: 09/905,615

(22) Filed: Jul. 13, 2001

Related U.S. Application Data

(60) Provisional application No. 60/296,654, filed on Jun. 6, 2001.

(51) Int. Cl.[7] .............................................. H03M 13/51
(52) U.S. Cl. ..................... 714/704; 714/705; 714/707
(58) Field of Search .............................. 714/704, 705, 714/707, 708

(56) References Cited

U.S. PATENT DOCUMENTS

| | | | | |
|---|---|---|---|---|
| 4,811,361 A | * | 3/1989 | Bacou et al. ................ | 375/242 |
| 5,566,206 A | * | 10/1996 | Butler et al. ................. | 375/225 |
| 5,666,159 A | * | 9/1997 | Parulski et al. ........... | 348/211.2 |
| 5,666,170 A | * | 9/1997 | Stewart ....................... | 348/726 |
| 5,721,756 A | * | 2/1998 | Liebetreu et al. ........... | 375/344 |
| 5,963,853 A | * | 10/1999 | Berg et al. ..................... | 455/77 |
| 6,205,187 B1 | * | 3/2001 | Westfall ..................... | 375/341 |
| 6,404,822 B1 | * | 6/2002 | Ben-Michael et al. ...... | 375/296 |
| 6,577,696 B1 | * | 6/2003 | Burgmeier et al. ......... | 375/376 |
| 6,757,327 B1 | * | 6/2004 | Fiedler ....................... | 375/232 |

FOREIGN PATENT DOCUMENTS

| | | | | | |
|---|---|---|---|---|---|
| GB | | 2180725 A | * | 4/1987 | ........... H03M 5/12 |

* cited by examiner

*Primary Examiner*—Stephen M. Baker
(74) *Attorney, Agent, or Firm*—Perkins Coie LLP

(57) ABSTRACT

A system and method for measuring and utilizing a pseudo pixel error rate in digital data transmission is disclosed. As an alternative to measuring actual pixel error rate measurement, the present invention uses a pseudo pixel error rate detection scheme where the errors occurred in the special character patterns used in data encoding are measured. A particular embodiment uses a de-glitch filter for filtering the glitches from an unfiltered data enable (DE), a delay for delaying the unfiltered DE to match the delay of the de-glitch filter, and a comparator for comparing the unfiltered DE and the filtered DE to determine the occurrence of an error. It further includes a counter to count the errors occurred.

46 Claims, 6 Drawing Sheets

SYSTEM AND METHOD FOR MEASURING PSEUDO PIXEL ERROR RATE

RELATED APPLICATION

This application claims the benefit of co-pending U.S. Provisional Application No. 60/296,654, filed on Jun. 6, 2001, entitled "Pseudo Pixel Error Detector for TMDS."

BACKGROUND OF THE INVENTION

Technical Field

This invention related to data communications. More specifically, this invention relates to a system and method for measuring and utilizing a pseudo pixel error rate in digital data transmission.

DESCRIPTION OF THE RELATED ART

In high-speed data communications, signals carrying data become distorted as the signals are transmitted over a channel. The exact behavior of distortion depends on the channel characteristics. If the channel characteristics can be discovered, the data may be restored by processing the received signals to compensate for the effect of the channel distortion, such as by using adaptive equalization of the received signals.

For example, in digital data transmission where digital signals carrying video information are transmitted over a channel, pixel errors may occur depending on the quality and state of the channel. A pixel error rate, the rate of pixel errors occurring in a given time interval, is a useful measure of the channel characterization, which can be used to restore the video information against channel distortion.

There are ways to measure an error rate, but most of them require a predetermined training sequence or a specially designed code called an "error detection code". Many digital communication systems use a data encoding scheme, but such encoding is not designed for an error detection purpose. A conventional way to measure the error rate of a communication channel is to count the actual errors from a known sequence, called a training sequence. But there are many cases where a predefined training sequence is not available. For example, in the Digital Visual Interface (DVI), a set of video transmission standards using Transition Minimized Differential Signaling (TMDS), there is no specific training sequence defined. Without a predefined training sequence, it is not an easy task to perform pixel error detection in video transmission.

Therefore, there is a need for a technique to measure a pixel error rate in digital data transmission over a channel without resorting to a specific training sequence or a specifically designed error detection code.

SUMMARY OF THE INVENTION

It is an object of the present invention to measure a pixel error rate during digital data transmission without using a separate training sequence.

Another object of the present invention is to measure a pixel error rate without using a specially designed error detection code.

Still another object is to utilize the measured pixel error rate to adjust parameters of the receiver.

The foregoing and other objects are accomplished by providing a method and system for measuring a pseudo pixel error rate. In one embodiment, the pseudo pixel error rate is measured by detecting glitches from a data enable signal (DE) used in digital data transmission. The system has a de-glitch filter for filtering out glitches from an unfiltered data enable (DE) signal, and a comparator for comparing the filtered DE signal with the unfiltered DE signal to detect an occurrence of error. The system may further include a counter for counting the errors occurred.

In another embodiment, data encoding used in digital data transmission is used to measure a pseudo error rate. The system has a decoder for decoding the encoded signal, an encoder for re-encoding the decoded signal, and a comparator for comparing the re-encoded signal with the original signal to detect an error.

DETAILED DESCRIPTION OF THE INVENTION

Error Detection Based on Detecting DE Glitches

Figure 1:
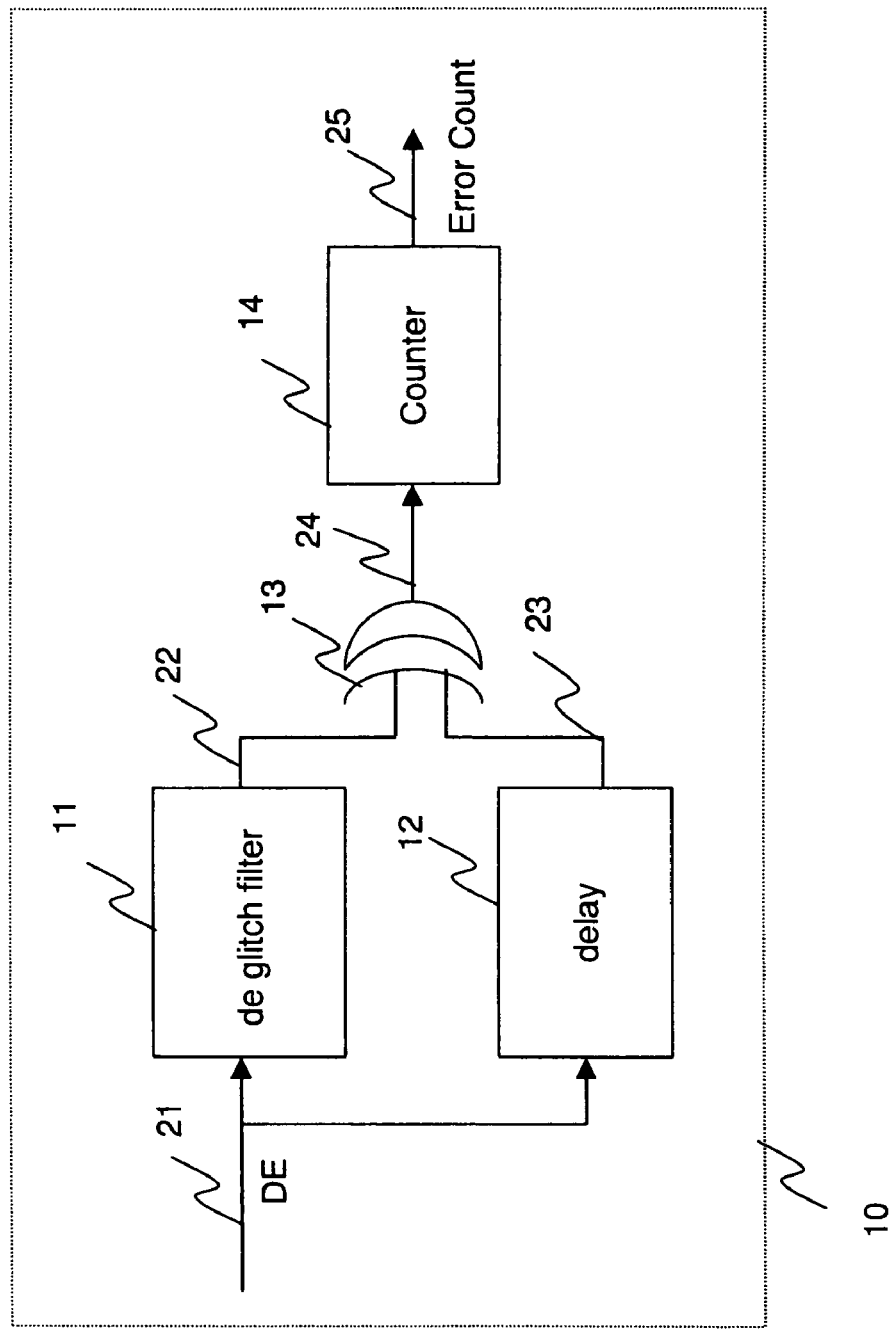
FIG. 1 is a block diagram of a system for measuring a pseudo pixel error rate based on detecting glitches from the DE signal.

FIG. 1 shows a block diagram of a system for measuring a pseudo pixel error rate based on detecting glitches in the data enable (DE) signal in digital data transmission. In a video transmission system using digital interface, such as the Digital Visual Interface (DVI) using Transition Minimized Differential Signaling (TMDS) as the base electrical interconnection, the transmitter encodes either pixel data or control data depending on the state of the data enable (DE) signal. Pixel data transitions are made only when DE is high (during active video) whereas control data transitions are made only when DE is low (during inactive or blank video). For more information on DVI, refer to DVI Specification Revision 1.0, Apr. 2, 1999 from Digital Display Working Group (DDWG).

The DE signal is identified by the presence of a special character pattern in a bit stream. At the receiver, the presence of the special character pattern is detected by precise pattern matching. Even one bit error in the special character stream can cause a glitch in the DE signal. Since these glitches are undesirable, usually glitches for each channel are filtered, and then the DE's from all channels are logically ANDed for a final DE output.

A system 10 for measuring a pseudo pixel error rate is comprised of a de-glitch filter 11, a delay unit 12, and an XOR gate 13. The de-glitch filter filters out glitches from an unfiltered DE signal 21 to generate a filtered DE signal 22. The delay unit 12 delays the unfiltered DE signal 21 to generate a delayed unfiltered DE signal 23. The delay is designed to the same as the processing time of the de glitch filter so that the delayed unfiltered DE signal 23 is compared with the filtered DE signal 22 by the XOR gate 13 to detect an occurrence of a glitch error as an output 24.

The system 10 may further include a counter 14 to count the glitch errors to determine a pseudo pixel error rate as an output 25. The system 10 may include more than one de-glitch filter, for example, one for each of the channels conveying red, green, and blue information.

Figure 2:
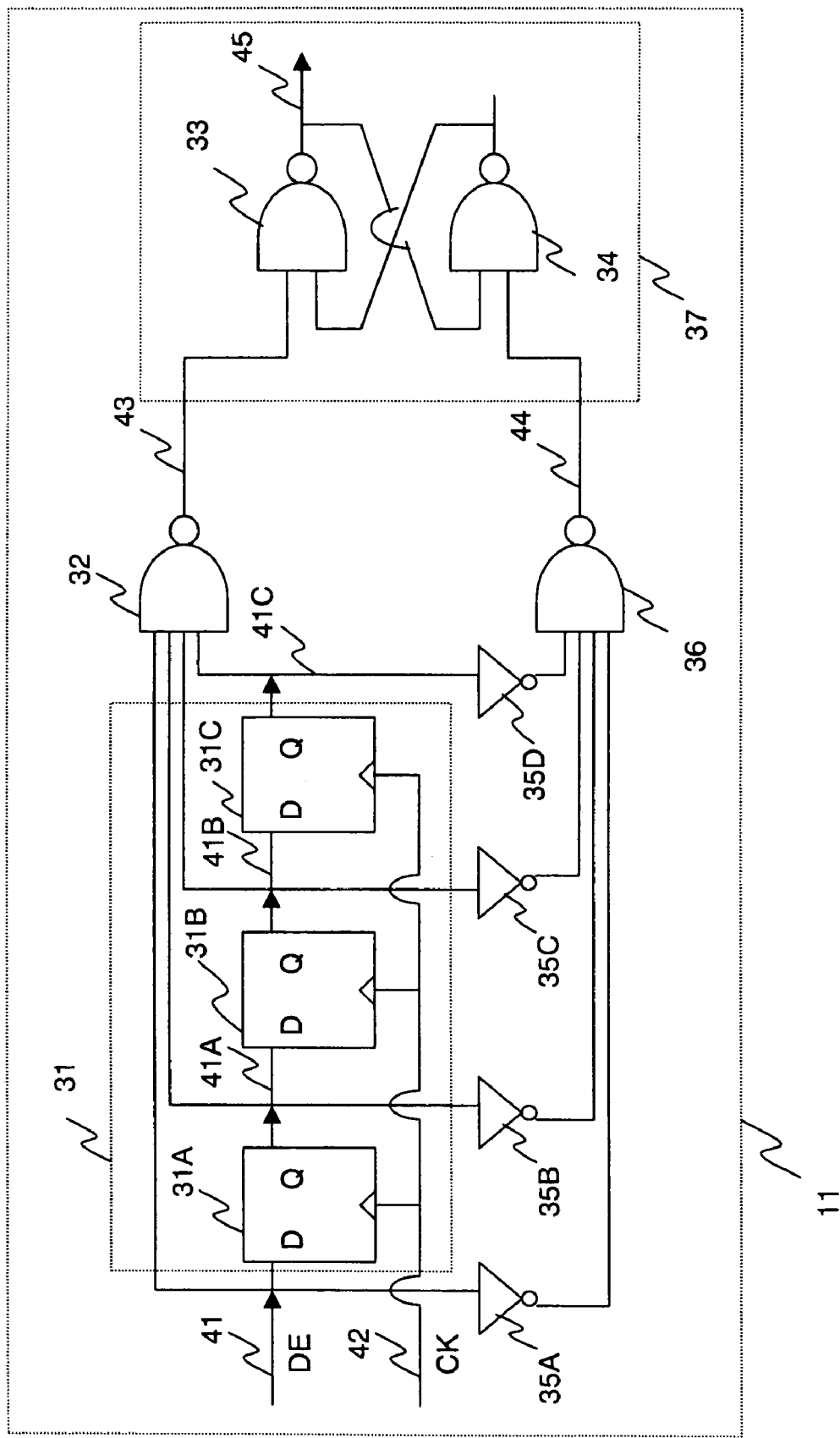
FIG. 2 is a block diagram of an embodiment of the de-glitch filter used by the system.

The error rate measured by the system 10 is termed a pseudo pixel error rate for the following reasons. The errors rate measured is not for all the errors occurred because the error rate is measured only when the DE signal is low (during the video inactive/blanking period). In the case of TMDS, special characters are used that are rich in transitions when the DE signal is low. Inter-symbol interference (ISI) is low in such special character stream. In addition, the graphics controller responsible for generating data and control signals usually do not generate much jitter when the DE signal is low because less computation is performed when DE is low. Therefore, The error rate when the DE signal is low is measured in a condition better than the actual situation in which the actual error rate could be higher. Nevertheless, the pseudo pixel error rate still provides a useful measure of the channel characteristics because there is a correlation between the pseudo error rate and the actual error rate, FIG. 2 shows an implementation of the de-glitch filter 11. The filter 11 has a shift register 31 consisting of multiple D flip-flops 31A, 31B, and 31C that sample an input DE signal 41 for a given clock period, and an NAND gate 32 for combining the input DE signal 41 and the sampled outputs 41A, 41B, and 41C to produce a combined output 43. The filter has an SR-latch 37 consisting of cross-coupled NAND gates 33 and 34 for latching the output of the NAND gate 32.

When the DE signal is high during the video active period, the combined output 43 of the NAND gate 32 goes low to set the SR latch 37 to a "set" state. Even if the DE signal goes high momentarily due to a glitch to drive the output of the NAND 32 to high, the "set" state of the SR latch 37 would be maintained because of the latching characteristic.

The system also has inverters 35A, 35B, 35C, and 35D for inverting input 41, sampled outputs 41A, 41B and 41C, and an NAND gate 36 for producing a combined inverted output 44. If the DE signal goes down for a given period (the same number of clock cycles as the number of D flip-flop stages) indicating a non-glitch condition, the combined inverted output 44 goes low, which resets the SR-latch 37 to a "reset" state.

Figure 3:
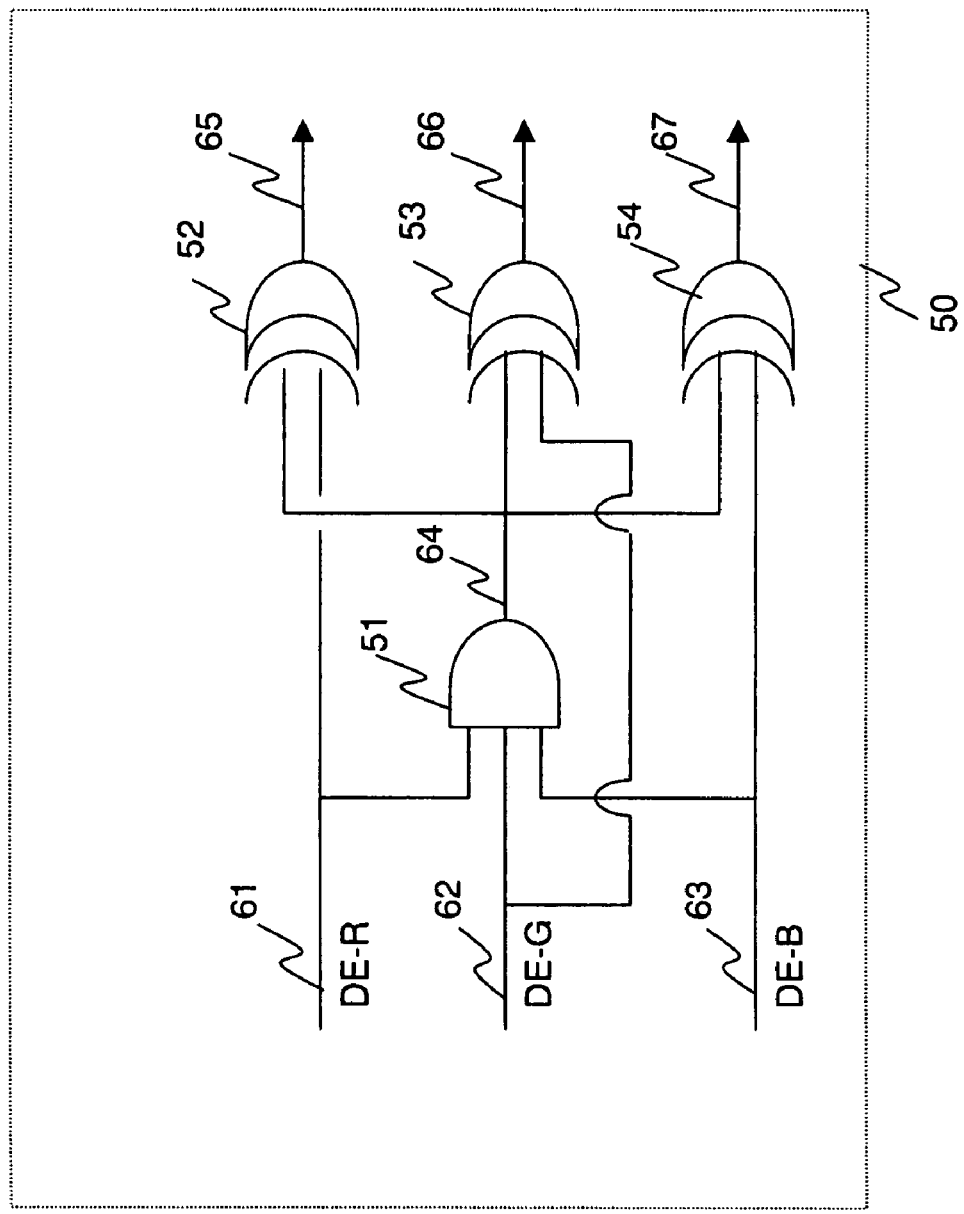
FIG. 3 is a block diagram of an alternative embodiment of the de-glitch filter.

FIG. 3 shows an alternative implementation of the de-glitch filter 11. The implementation 50 is based on the observation that in a video system, such as a DVI system using TMDS, a momentarily high condition is likely to be a glitch, but not a momentarily low condition. The glitch (momentarily high) is filtered by combining the DE signals in each channel, namely, DE-R (red) 61, DE-G (green) 62, DE-B (blue) 63, using an AND gate 51 to produce a filtered DE 64. The filtered DE 64 is compared with each DE-R 61, DE-G 62, DE-63 using XORs 52, 53 and 54. By comparing the filtered DE signal 64 and the unfiltered DE signals 61, 62 and 63, a pseudo pixel error rate can be determined.

Although the preferred embodiment of pseudo pixel error rate measurement described above was based on detecting glitches in the DE signal, those skilled in the art would appreciate that a similar technique may be used to measure a pseudo pixel error rate by detecting glitches in other control signals such as H-Sync and V-Sync.

Error Detection Based on Re-Encoding

Figure 4:
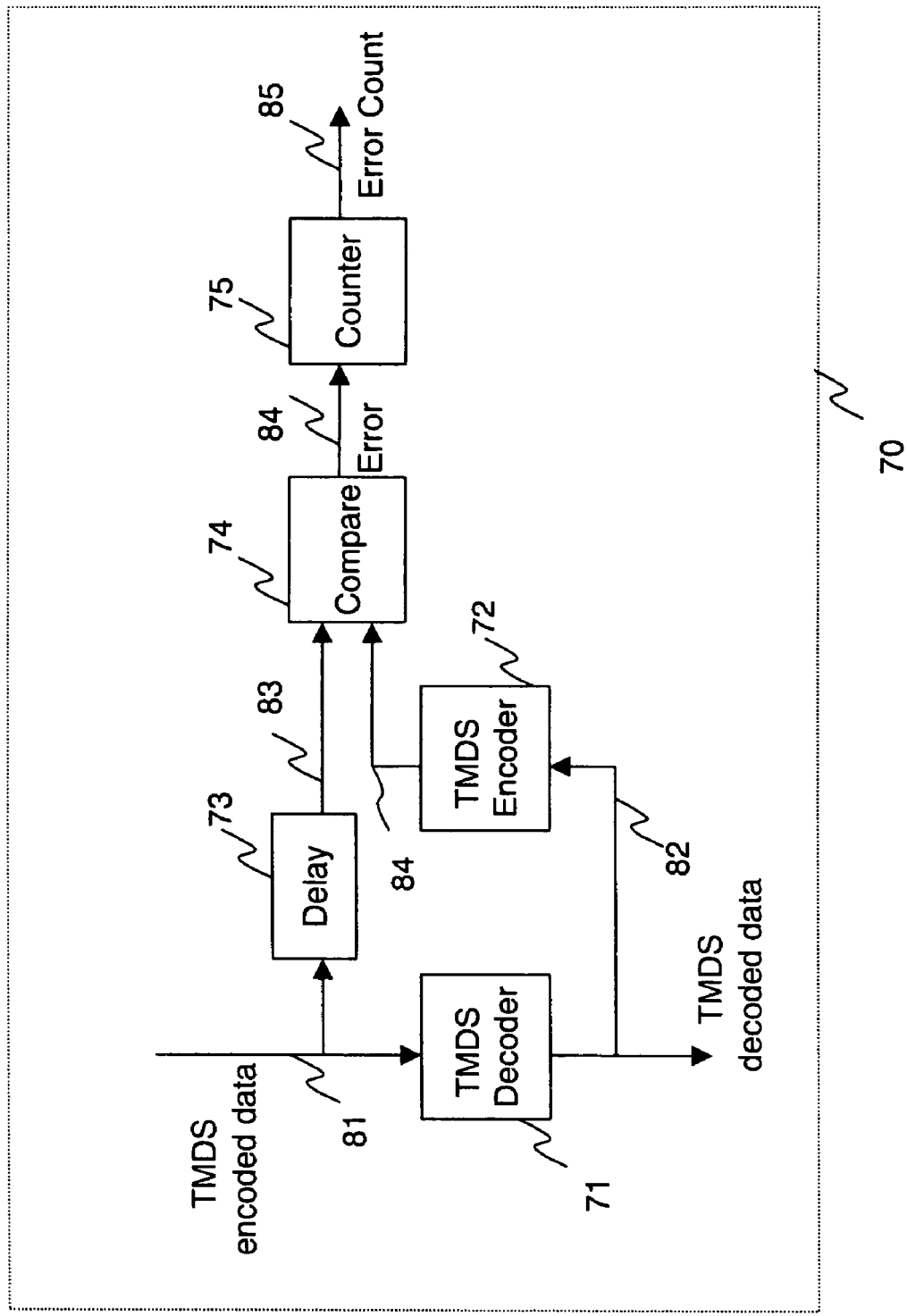
FIG. 4 is a block diagram of a system for measuring a pseudo pixel error rate based on a re-encoding decoded data received.

FIG. 4 shows an alternative embodiment for measuring a pseudo pixel error rate based on re-encoding of decoded data in digital data transmission using data encoding. The particular embodiment 70 is shown using the data encoding method of TMDS. In a digital system, such as a DVI system using TMDS, the transmitter encodes and serially transmits an input data stream. For example, the DVI transmitter uses TMDS to encode 8-bit characters into 10-bit characters so that it may be transmitted with reduced EMI and with DC-balancing. Those 10-bit characters representing the original 8-bit data information are called in-band characters. Those 10-bit characters that do not correspond to the original 8-bit data information are called out-of-band (OOB) characters and are used to convey control information.

At the receiver, a TMDS encoded signal 81 containing 10-bit characters is decoded into data containing 8-bit characters 82 by a TMDS decoder 71. If there has been an error in the encoded signal changing an in-band character into an out-of-band character (OOB), the error can be detected by a table look-up, the process of comparing each 10-bit encoded character with either the set of specially designated 10-bit OOB characters or the set of 10-bit in-band characters. However, such implementation may be expensive in hardware because of the searching process involved.

Instead, each 8-bit character 82 decoded from the corresponding 10-bit encoded character is converted back to re-encoded data of 10 bits 84 using a TMDS encoder 72. If there has been an error due to channel distortion, the error may convert an originally an in-band character to an OOB character. Then the erred 10-bit encoded OOB character can be decoded into an 8-bit character because the decoding process does not distinguish whether the encoded character is an in-band or OOB character. But the re-encoded character from the 8-bit character may not be the same as the earlier 10-bit OOB encoded character because the re-encoding process only maps an 8-bit character to in-band characters, and never results in OOB characters.

The original 10-bit encoded data 81 is delayed using a delay unit 73 so that delayed original data 83 is compared with to the re-encoded data 84 using a comparator 74. If the two are different, an error 84 is detected. Memory may be needed to hold the incoming characters for the latency of the forward and backward conversion processes. The system 70 may further include a counter 75 to count the errors to determine a pseudo pixel error rate as an output 85.

It is noted that the error detection scheme FIG. 4 is useful regardless of whether DE is high or low. Although the preferred embodiment measures an error rate when DE is high, the same technique can be used to measure an error rate when DE is low, in which case it becomes equivalent to the embodiment based on detecting the DE glitch.

The TMDS encoding process consists of transition minimized coding followed by DC balancing. Although a full error detection scheme needs the DC balancing part, practical error detection may needs only the transition minimized coding part to determine whether there was an error causing a transition from an in-band to an OOB characters. By restricting the error detection process to the transition minimized coding part, the complexity of re-encoding hardware may be substantially reduced. Or a full error detection scheme may operate until the first detection of an error at which time the DE-balancing part may be turned off because the DC-balancing information after an error occurrence loses reliability.

From the nature of TMDS encoded code space, the pseudo error rate measures described above can model the random bit error quite accurately but not the bit errors related to inter-symbol interference (ISI). One method to measure the errors related to ISI is to count the sample intervals in over-sampled domain. If the sample intervals are distributed closely to the integer multiple of 3 in a 3-times oversampling scheme, the ISI error level is low, otherwise, the ISI error level is high.

As mentioned above, although pseudo-pixel error detection provides a good measure of the error rate, it itself is not an actual error rate. However, the correlation between the pseudo-pixel error rate and the actual pixel error rate may be used to estimate the actual error rate.

Figure 5:
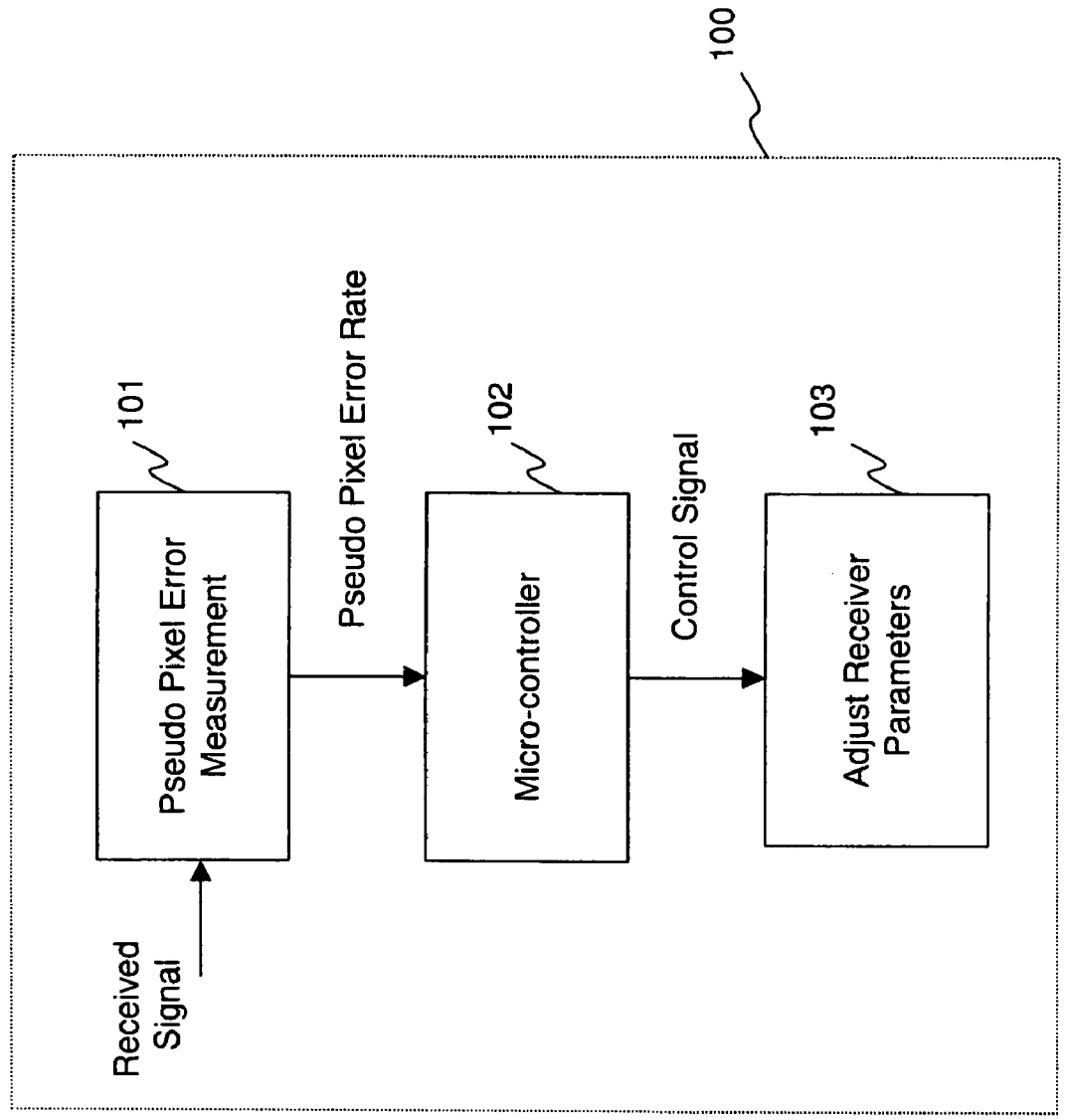
FIG. 5 is a block diagram of a system for utilizing the pseudo pixel error rate to adjust the receiver parameters.

FIG. 5 shows a block diagram of a system to use the measured pseudo pixel error rate to adjust the receiver parameters. The system 100 is comprised of a pseudo pixel error rate measurement unit 101 described above, a micro-controller 102 responsible for adjusting the receiver's operation to minimize the errors, and a circuit 103 for adjusting receiver parameters.

Once the pseudo pixel error rate is measured, the value may be stored in a register so that it is conveniently accessible by the micro-controller 102. The micro-controller may adjust various parameters of the receiver's operation, including the termination resistance, equalization, clocking scheme, bandwidth adaptation, sampling method, etc., to reduce the pixel error rate.

Figure 6:
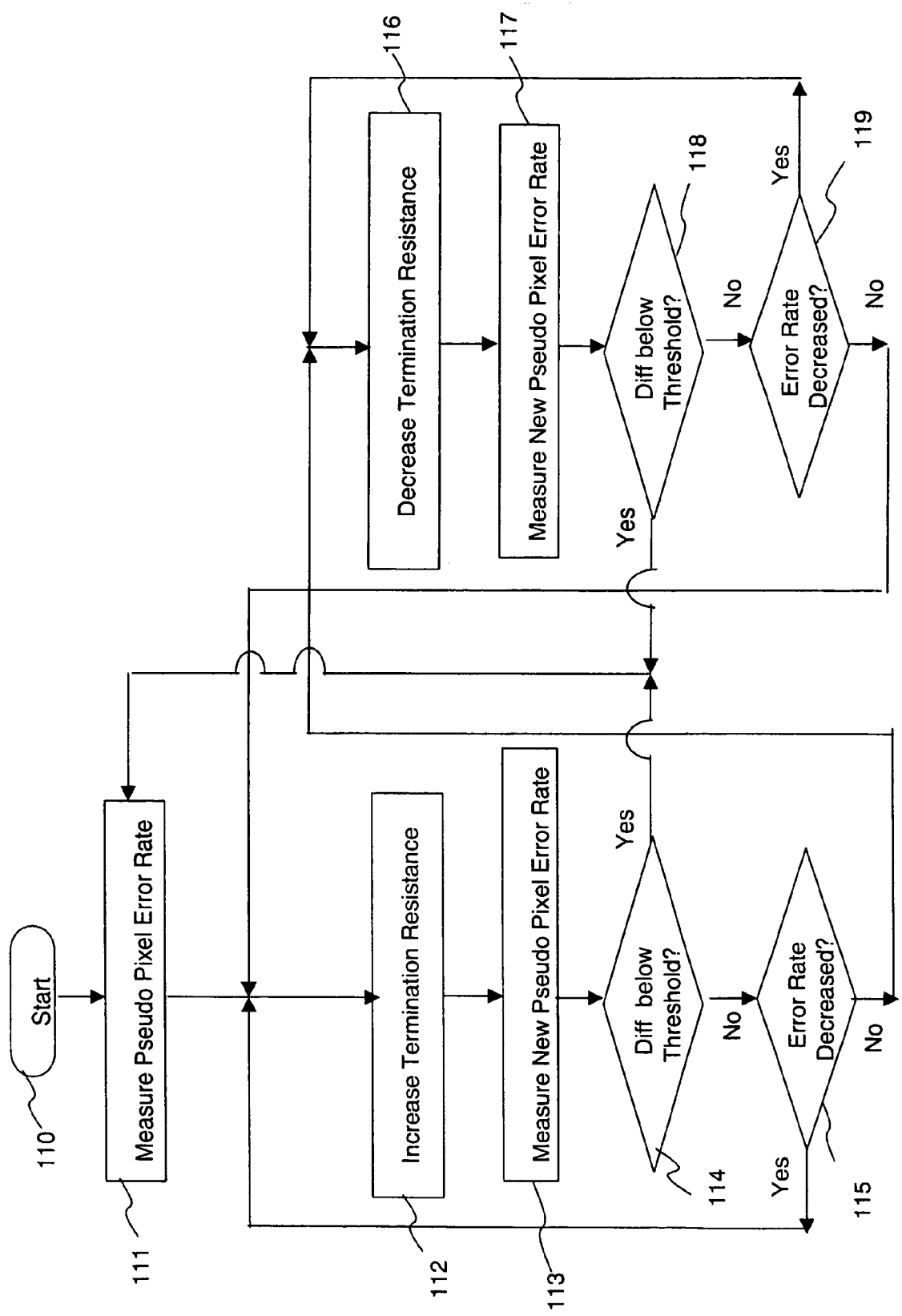
FIG. 6 is a flow chart of operations performed by a micro-controller to adjust receiver parameters to reduce the pseudo pixel error rate.

FIG. 6 shows a flow chart of an exemplary operation performed by the micro-controller. The example shows that a termination resistance, one of the receiver, parameters, is adjusted by a trial and error process of iterating the steps of either incrementing or decrementing a particular parameter of the loop receiver.

After a start in step 110, the pseudo pixel error rate (PER) is measured in step 111. The measured PER serves as a reference value. After the termination resistance is increased by a step size in step 112, another PER is measured in step 113. The difference between the new PER and the old PER is checked in step 114 as to whether it is below a threshold not. If it is below the threshold, the flow goes back to the step of 111 where the PER is measured again without further changing the termination resistance. Otherwise, the new PER is checked in step 115 as to whether the PER has been decreased with respect to the reference value. If so, it goes back to step 112 where the termination resistance is increased again by a step size.

If the error rate has not been decreased, the flow moves to step 116 where the termination resistance is decreased rather than increased by a step size. Then, a new PER is measured in step 117. The difference between the new PER and the old PER is checked in step 118 as to whether it is below a threshold or not. If so, the flow goes back to the step of 111 where the PER is measured again without further changing the termination resistance. Otherwise, the new PER is checked as to whether the PER has been decreased in step 119. If so, the flow moves to step 116 where the termination resistance is further decreased. If not, the flow moves to step 112 where the termination resistance is increased rather than decreased.

If a single measure of the pseudo error rate is adopted, then a search may be performed in the parameter space of the receiver operation to minimize the error rate, starting with the parameter most likely to reduce the error rate. If multiple measures are used, a smarter search may be performed, starting with the method most directly tied to the measure.

For example, the run-length, the length of the same polarity bits in a serial bit stream, in the over-sampled signal domain may be observed. For example, if 3× oversampling is used, the run length should be an integer multiple of 3. If irregular run-lengths have been observed, the most likely cause of the problem is a signal degradation due to the channel bandwidth. The direct way to fix this problem would be to change the adaptive channel equalizer configuration. The configuration may be changed incrementally to reduce the irregularity of the run-length. If the incremental adjustment does not result in the regularity of the run-length, the entire space of possible configurations may be searched by sweeping through the space, i.e., by changing the configuration each time to find the configuration what would provide the minimum in the irregularity of the run-length.

It should be apparent to those skilled in the art that the re-encoding scheme of the present invention may be readily extended to digital transmission using data encoding. The scheme provides a data recovery diagnosis at the receiver side during operation without any help from the corresponding transmitter by exploiting the inherent redundancy in the data encoding process, such as TMDS. Since only part of the code space is being utilized at any time, the re-encoding scheme can determine when a transition is made from a valid sub-space to an invalid one, such as from in-band to OOB.

While the invention has been described with reference to preferred embodiments, it is not intended to be limited to those embodiments. It will be appreciated by those of ordinary skill in the art that many modifications can be made to the structure and form of the described embodiments without departing from the spirit and scope of this invention.

For example, the preferred embodiments have been described using TMDS data coding, those skilled in the art would appreciate that the present invention can be readily applied or modified to work with other encoded serial bit streams having in-band and out-of-band characters.

What is claimed is:

1. A system for measuring a pseudo pixel error rate in digital data transmission using a data enable (DE) signal, comprising:
   a de-glitch filter for filtering a glitch from an unfiltered DE signal to generate a filtered DE signal after a predetermined processing time;
   a delay unit for delaying the unfiltered DE signal to match the processing time of the de-glitch filter; and
   a comparator for comparing the filtered DE signal and the unfiltered DE signal to detect an occurrence of error.

2. The system of claim 1, wherein the comparator is an XOR circuit.

3. The system of claim 1, further comprising a counter for counting the errors to determine the pseudo pixel error rate.

4. The system of claim 1, wherein the de-glitch filter comprises:
   a shift register for sampling the unfiltered DE signal to generate sampled input bits;
   a first combining circuit for generating signals when all the sampled inputs bits are high;
   a plurality if inverters for generating inversion of the sampled input bits;
   a second combining means for generating signals when all the inverted, sampled inputs are high; and
   an SR-latch connected to the outputs of the first and second combining means to produce the filtered DE signal.

5. The system of claim 1, wherein the digital data transmission complies with the DVI specification.

6. The system of claim 1, wherein the de-glitch filter comprises:

an AND circuit for combining DE signals from all channels to produce logical AND's of the DE signals as an output; and a comparator for comparing the output with the unfiltered DE signal to generate a filtered DE signal.

7. The system of claim 6, wherein the comparator is an XOR circuit.

8. A system for measuring a pseudo pixel error rate in digital data transmission using a data enable (DE) signal, comprising:

a de-glitch filter for filtering a glitch from an unfiltered (DE) signal to generate a filtered DE signal;

a comparator for comparing the filtered DE signal and the unfiltered DE signal to detect an occurrence of error and;

a counter for countering the errors to determine the pseudo pixel error rate.

9. The system of claim 8, wherein the digital data transmission complies with the DVI specification.

10. A system for measuring a pseudo pixel error rate in digital data transmission, comprising:

a receiver for receiving an encoded signal containing video;

a decoder for decoding the received signal to produce a decoded signal after a first processing time;

an encoder for re-encoding the decoded signal back to a re-encoded signal after a second processing time;

a delay for delaying the received signal to match the sum of the first and second processing time; and a comparator for comparing the re-encoded signal and the received signal to detect an occurrence of error, wherein the comparing is performed using a low data enable signal.

11. The system of claim 10, wherein the encoded signal is encoded using TMDS.

12. The system of claim 10, further comprising a counter for countering the errors to determine a pseudo pixel error rate.

13. A system for measuring a pseudo pixel error rate in digital transmission using data encoding, comprising:

a decoder for decoding received encoded signal to produce a decoded signal;

an encoder for re-encoding the decoded signal back to the re-encoded signal;

a comparator for comparing the re-encoded signal and the received signal to detect an occurrence of error, wherein the comparing is performed using a low data enable signal; and a counter for counting the errors to determine the pseudo pixel error rate.

14. The system of claim 13, wherein the data encoding uses TMDS.

15. A system for measuring a pseudo error rate in digital data transmission using data encoding, comprising:

a decoder for decoding a received encoded signal to produce a decoded signal;

an encoder for re-encoding the decoded signal back to a re-encoded signal;

a comparator for comparing the re-encoded signal and the received signal to detect an occurrence of error, wherein the comparing is performed using a low data enable signal; and a counter for counting the errors to determine the pseudo error rate.

16. A method for measuring a pseudo pixel error rate in digital data transmission using a data enable (DE) signal, comprising the steps of:

filtering a glitch from an unfiltered DE signal to generate a filtered DE signal after a predetermined processing time;

delaying the unfiltered DE signal to match the processing time of the de-glitch filter; and comparing the filtered DE signal and the unfiltered DE signal to detect an occurrence of error.

17. The method of claim 16, wherein the comparing step performs an XOR operation.

18. The method of claim 16, further comprising the step of counting the errors to determine the pseudo pixel error rate.

19. The system of claim 16, wherein the step of filtering comprises steps of:

sampling the unfiltered DE signal to generate sampled inputs bits;

generating a first signal when all the sampled inputs bits are high;

inverting the sampled input bits;

generating a second signal when all the inverted, sampled inputs are high; and latching by setting an output when the first signal is asserted and reset when the second signal is asserted.

20. The method of claim 16, wherein the digital data transmission complies with the DVI specification.

21. The method of claim 16, wherein the step of filtering comprises the steps of:

combining DE signals from all channels to produce logical AND's of the DE signals as an output; and comparing the output with the unfiltered DE signal to generate a filtered DE signal.

22. The method of claim 21, wherein the step of comparing performs a OXR operation.

23. A method of measuring a pseudo pixel error rate in digital data transmission using a data enable (DE) signal, comprising the steps of:

filtering a glitch from an unfiltered (DE) signal to generate a filtered DE signal;

comparing the filtered DE signal and the unfiltered DE signal to detect an occurrence of error and counting the errors to determine the pseudo pixel error rate.

24. The method of claim 23, wherein the digital data transmission complies with the DVI specification.

25. A method of measuring a pseudo pixel error rate in digital data transmission, comprising the steps of:

receiving an encoded signal containing video;

decoding the received signal to produce a decoded signal after a first processing time;

re-encoding the decoded signal back to a re-encoded signal after a second processing time;

delaying the received signal to match the sum of the first and second processing time;

comparing the re-encoded signal and the received signal to detect an occurrence of error, wherein the comparing is performed using a low data enable signal.

26. The method of claim 25, wherein the encoded signal is encoded using TMDS.

27. The method of claim 25, further comprising a counter for counting the errors to determine a pseudo pixel error rate.

28. A method of measuring a pseudo pixel error rate in digital data transmission using data encoding, comprising:

a decoder for decoding a received encoded signal to produce a decoded signal;

an encoder for re-encoding the decoded signal back to re-encoded signal;

a comparator for comparing the re-encoded signal and the received signal to detect an occurrence of error, wherein the comparing is performed using a low data enable signal; and a counter for counting the errors to determine the pseudo pixel error rate.

29. The method of claim 28, wherein the data encoding uses TMDS.

30. A method of measuring a pseudo error rate in digital data transmission using data encoding, comprising the steps of:
   receiving a signal containing an encoded character;
   comparing encoded character with a set of predefined in-band characters, wherein the comparing is performed using a low data enable signal;
   detecting an error if the encoded character is not the same as nay characters in the set; and
   counting the errors to determine the pseudo error rate.

31. The method of claim 30, wherein the data encoding uses TMDS.

32. A method of measuring a pseudo error rate in digital data transmission using data encoding, comprising the steps of:
   receiving a signal containing an encoded character;
   comparing the encoded character with a set of predefined out-of-band (OOB) characters, wherein the comparing is performed using a low data enable signal;
   detecting an error is the encoded character is the same as one of the OOB characters in the set; and
   counting the errors to determine the pseudo error rate.

33. The method of claim 32, wherein the data encoding uses TMDS.

34. A method of measuring the pseudo error rate in digital data transmission using data encoding, comprising the steps of:
   decoding a received encoded signal to produce a decoded signal;
   re-encoding the decoded signal back to a re-encoded signal;
   comparing the re-encoded signal and the received signal to detect an occurrence of error, wherein the comparing is performed using a low data enable signal; and
   counting the errors to determine the pseudo error rate.

35. A system for utilizing a pseudo pixel error rate in a receiver with adjustable parameters for use in digital data transmission, comprising the steps of:
   a detector for detecting pseudo pixel errors, wherein the detecting is performed using a low data enable signal;
   a counter for determining a pseudo pixel error rate; and
   a controller for adjusting the receiver parameters to reduce the pseudo pixel error rate.

36. The system of claim 35, wherein the receiver parameters include a receiver termination resistance.

37. The system of claim 35, wherein the receiver parameters include a receiver equalization scheme.

38. The system of claim 35, wherein the receiver parameters include a receiver clocking scheme.

39. The system of claim 35, wherein the receiver parameters include a receiver bandwidth.

40. The system of claim 35, wherein the receiver parameters include a receiver sampling method.

41. A method of utilizing a pseudo pixel error rate in a receiver with adjustable parameters for use in digital data transmission, comprising the steps of:
   detecting pseudo pixel errors, wherein the detecting is performed using a low data enable signal;
   determining a pseudo pixel error rate; and
   controlling the receiver parameters to reduce the pseudo pixel error rate.

42. The method of claim 41, wherein the receiver parameters include a receiver termination resistance.

43. The method of claim 41, wherein the receiver parameters include a receiver equalization scheme.

44. The method of claim 41, wherein the receiver parameters include a receiver clocking scheme.

45. The method of claim 41, wherein the receiver parameters include a receiver bandwidth.

46. The method of claim 41, wherein the receiver parameters include a receiver sampling method.

* * * * *